United States Patent [19]
Tang et al.

[11] Patent Number: 5,966,330
[45] Date of Patent: Oct. 12, 1999

[54] METHOD AND APPARATUS FOR MEASURING THE THRESHOLD VOLTAGE OF FLASH EEPROM MEMORY CELLS BEING APPLIED A VARIABLE CONTROL GATE BIAS

[75] Inventors: Yuan Tang, San Jose; Chien-Sheng Su, Saratoga, both of Calif.

[73] Assignee: EON Silicon Devices, Inc., Santa Clara, Calif.

[21] Appl. No.: 09/070,181

[22] Filed: Apr. 30, 1998

[51] Int. Cl.$^6$ .................................................. G11C 16/06
[52] U.S. Cl. ................................. 365/185.2; 365/185.3; 365/185.33; 365/185.27; 365/185.09
[58] Field of Search ............................. 365/185.2, 185.3, 365/185.27, 185.33, 185.09, 201, 210

[56] References Cited

U.S. PATENT DOCUMENTS

| | | | |
|---|---|---|---|
| 4,253,059 | 2/1981 | Bell et al. | 324/158.1 |
| 4,301,535 | 11/1981 | McKenny et al. | 365/185.22 |
| 5,153,853 | 10/1992 | Eby et al. | 365/185.08 |
| 5,600,594 | 2/1997 | Padoan et al. | 365/185.24 |

Primary Examiner—Andrew Q. Tran
Attorney, Agent, or Firm—Davis Chin

[57] ABSTRACT

There is provided a method of measuring the value of the threshold voltage of a memory core cell in an array of flash EEPROM memory core cells. The memory core cell includes an array core transistor having a corresponding array threshold voltage which is to be measured. There is provided a reference current level at a constant value which is generated by a reference cell transistor having a fixed bias condition and a fixed threshold voltage so that the relationship of the bias voltage applied to its gate and the fixed threshold voltage is linear. A control gate bias voltage applied to the gate of the array core transistor having the array threshold voltage which is to be measured is varied continuously. The varied control gate bias voltage and the reference current level is compared so as to generate a high logic when the varied control gate bias voltage produces a core cell current which is greater than the reference current level to obtain immediately the value of the threshold voltage of the array core transistor.

18 Claims, 3 Drawing Sheets

METHOD AND APPARATUS FOR MEASURING THE THRESHOLD VOLTAGE OF FLASH EEPROM MEMORY CELLS BEING APPLIED A VARIABLE CONTROL GATE BIAS

BACKGROUND OF THE INVENTION

1. Field of the Invention

This invention relates generally to non-volatile memory devices having a floating gate such as an array of flash electrically erasable and programmable read-only memory (EEPROMs) devices. More particularly, the present invention relates to a new and novel method of determining the value of the threshold voltage of a memory core cell in an array of flash EEPROM memory core cells by reading the core cell.

2. Description of the Prior Art

One type of non-volatile memory device is referred to as "flash EEPROMs" which are both programmable and erasable electrically. FIG. 1 illustrates a prior art cross-sectional view of a flash EEPROM cell 10. In these flash memories, a plurality of such one-transistor flash EEPROM cells 10 may be formed on a p-type semiconductor substrate (P-Well) 12 in which each is comprised of an $n^+$ drain region 14 and an $n^+$ source region 16 both formed integrally within the substrate. A relatively thin gate dielectric layer 18 is interposed between a top surface of the substrate 12 and a conductive polysilicon floating gate 20. A polysilicon control gate 22 is insulatively supported above the floating gate 20 by a second dielectric layer 24. A channel region 26 in the substrate separates the drain and source regions (14, 16). Further, there are provided terminal pins 28, 30, 32 and 34 for applying a source voltage $V_S$ to the source region 16, a gate voltage $V_G$ to the control gate 22, a drain voltage $V_D$ to the drain region 14, and a well voltage $V_W$ to the substrate 12, respectively.

As is well-known, the charge of the floating gate 20 of the one-transistor cell 10 of FIG. 1 is dependent upon the number of electrons contained in the floating gate. During the programming mode, electrons are added to the floating gate of the cell 10 so as to increase its threshold voltage. The term "threshold" refers to a gate-to-source voltage that must be applied between the gate and the source of the cell in order to cause it to conduct. During the erase mode, electrons are removed from the floating gate of the cell so as to decrease its threshold voltage. In programmed state, the threshold voltage of a cell is typically set at greater than +6.5 volts, while the threshold voltage of a cell in an erased state is typically limited below +3.0 volts.

In order to determine whether the cell has been programmed or not, the cell is read by applying a small positive voltage to the control gate between the +3.0 and +6.5 volt range, typically +5.0 volts, with the source region held at a ground potential (0 volts) and the drain held at a potential between +1 to +2 volts. If the transistor cell conducts or is turned-on, a current will flow through the transistor representing a "1" bit or erased state. On the other hand, if the transistor cell does not conduct or is turned-off no current will flow through the transistor representing a "0" bit or programmed state.

FIG. 2 is a simplified functional block diagram of a conventional semiconductor integrated memory circuit device 100 which includes a flash EEPROM memory array 102 formed of a plurality of memory core cells MC11–MCnm (each being formed such as the one shown in FIG. 1). The plurality of memory cells MC11–MCnm are arranged in an n×m matrix on a single integrated circuit chip. Each of the memory cells is comprised of one of the array core transistors $Q_{P11}$ through $Q_{Pnm}$ which function as a memory transistor for storing data "1" or "0" therein. Each of the core transistors has its drain connected to one of the plurality of bit lines BL0–BLm which are, in turn, connected to a bit line pull-up circuit 104 and a column address decoder 106. All of the sources of the array core transistors are connected to a common array ground potential VSS. Each of the core transistors also has its control gate connected to one of the plurality of word lines WL0–WLn which are, in turn, connected to a row address decoder 108.

The row address decoder 108 receives voltage signals from a power supply 110 and distributes the individual voltage signals to the corresponding word lines WL0–WLn in response to row address signals $A_i$ received from a state machine 112. At the same time, the bit line pullup circuit 104 receives voltages from the power supply 110 and distributes the individual voltage signals to the corresponding bit lines BL0–BLm in response to signals received from the state machine 112. The column decoder 106 provides signals from the various bit lines BL0–BLm to sense amplifiers or comparators 114 in response to column address signals $A_j$ received from the state machine 112. Further, the sense amplifiers 114 receive a signal from reference cells of a reference array 116. Responsive to the signals from the column decoder 106 and the reference array 116, the sense amplifiers 114 generate a signal indicating a state of the corresponding bit lines BL0–BLm relative to a reference cell line REF which is then passed through data latches 118 to the state machine 112.

In addition, it will be noted that the reference array 116 includes a plurality of reference cells RC1–RCn each being formed by one corresponding reference cell transistor $Q_{R1}$–$Q_{Rn}$. The gates of the array core transistors $Q_{P11}$ through $Q_{Pnm}$ and the reference cell transistors $Q_{R1}$–$Q_{Rn}$ located in the same row are connected to the same word line. For instance, the gates of the transistors $Q_{P11}$–$Q_{P1m}$ and $Q_{R1}$ are all connected to the word line WL0. Such semiconductor memory circuit device 100 as described and illustrated thus far is similar to the one in U.S. Pat. No. 5,142,496 to M. A. Van Buskirk entitled "Method for Measuring $V_T$'S Less Than Zero Without Applying Negative Voltages," which is hereby incorporated by reference in its entirety.

With reference to FIG. 3 of the drawings, there is shown a simplified schematic circuit diagram of certain portions of the memory circuit device 100 of FIG. 2 to explain how the threshold voltage $V_{TP}$ of one array core transistor $Q_P$ is measured in the '496 patent of the prior art. In particular, the measuring circuitry 300 of FIG. 3 includes a comparator 120, a reference resistor 122 having a resistance value $R_2$, a sense ratio resistor 124 having a resistance value $R_1$ (n×R2), a core transistor $Q_P$ and a reference transistor $Q_R$. The comparator 120 is actually one of the sense amplifiers 114 of FIG. 2.

The reference resistor 122 has its one end connected to a supply potential or voltage VCC, which is typically at +1.0 volts, and its other end connected to the non-inverting input of the comparator 120 at node A. The node A is also connected to the drain of the reference transistor $Q_R$ via the reference cell line REF. One end of the sense ratio resistor 124 is also connected to the supply potential VCC, and the other end thereof is connected to the inverting input of the comparator 120 at node B. The node B is also connected to the drain of the core transistor $Q_P$ via the selected bit line BL. As can be seen, the gates of the core transistor $Q_P$ and the reference transistor $Q_R$ are connected together and receive the same control gate voltage $V_g$ via the selected word line WL. The sense ratio is defined by the number n, where n is typically greater than 1 during the read mode of operation.

In order to measure the threshold voltage $V_{TP}$ of the core transistor $Q_P$ to determine if it is positive or negative, the comparator 120 is used to effectively compare the threshold voltage $V_{TP}$ of the core transistor $Q_P$ to the threshold voltage $V_{TR}$ of the reference transistor $Q_R$. If the threshold voltage $V_{TP}$ is less than the threshold voltage $V_{TR}$, the comparator 120 will output a logic "1." On the other hand, if the threshold voltage $V_{TP}$ is greater than the threshold voltage $V_{TR}$ then the comparator 120 will output a logic "0." However, the actual value of the threshold voltage $V_{TP}$ in relationship to the value of the threshold voltage $V_{TR}$ is not straightforward, but must be calculated mathematically by equation (1) in the '496 patent. In other words, the threshold voltage $V_{TP}$ must be calculated after the word line voltage at which the output of the comparator is changed is known, by inserting the same as well as the sense ratio and the threshold voltage $V_{TR}$ into the equation (1).

Accordingly, there has been discovered by the inventor a new and novel method of determining the value of the threshold voltage of a memory core cell by simply reading the core cell without requiring any complicated calculations to be performed. The present invention represents a significant improvement over the aforementioned '496 patent of the prior art and as illustrated in FIGS. 2 and 3.

SUMMARY OF THE INVENTION

Accordingly, it is a general object of the present invention to provide a method of determining the value of the threshold voltage of a memory core cell in an array of flash EEPROM memory core cells by reading the core cell.

It is an object of the present invention to provide a method of determining the value of the threshold voltage of a memory core cell in which the relationship between a switched control gate and the threshold voltage of the memory core cell is known and is linear.

It is another object of the present invention to provide a method of determining the value of the threshold voltage of a memory core cell which includes a reference transistor having a reference current level that is fixed at a constant value with respect to a gate bias applied to its control gate.

It is still another object of the present invention to provide a method of determining the value of the threshold voltage of a memory core cell which includes a reference transistor having a reference current level that is fixed at a constant value by either setting the threshold voltage of the reference transistor or by setting the gate bias thereof.

It is still yet another object of the present invention to provide a method of determining the value of the threshold voltage of a memory core cell which includes a reference transistor having a reference current level that is adjusted to one of a high value so as to measure the threshold voltage of an over-erased cell and a low value so as to measure the threshold voltage of a programmed cell.

In a preferred embodiment of the present invention, there is provided a method of measuring the value of the threshold voltage of a memory core cell in an array of flash EEPROM memory core cells. There is provided a cell matrix having a plurality of memory cells arranged in rows of word lines and columns of bit lines intersecting the rows of word line. Each of the memory cells includes a floating gate array core transistor having its control gate connected to one of the rows of word lines, its drain connected to one of the columns of bit lines, and its source and substrate connected to a ground potential. Each of the array core transistors has a corresponding array threshold voltage which is to be measured.

A reference current level at a constant value is provided which is generated by a reference cell transistor having a fixed bias condition and a fixed threshold voltage so that the relationship of the bias voltage applied to its gate and the fixed threshold voltage is linear. A control gate bias voltage applied to the gate of the array core transistor having the array threshold voltage which is to be measured is varied continuously. The varied control gate bias gate voltage and the reference current level are compared and a high logic is generated when the varied control gate bias voltage produces a core cell current which is greater than the reference current level to obtain immediately the value of the threshold voltage of the array core cell transistor.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

A new and novel method of determining the value of the threshold voltage of a memory core cell in an array of flash EEPROM memory cells by reading the core cell is described. In the following description, numerous specific details are set forth, such as specific circuit configurations, components and the like in order to provide a thorough understanding of the present invention. However, it should be apparent to those skilled in the art that the present invention may be practiced without the specific details. In other instances, well-known processes, circuits and control lines, not particularly relevant to the understanding of the operating principles of the present invention, have been purposely omitted for the sake of clarity.

Figure 1:
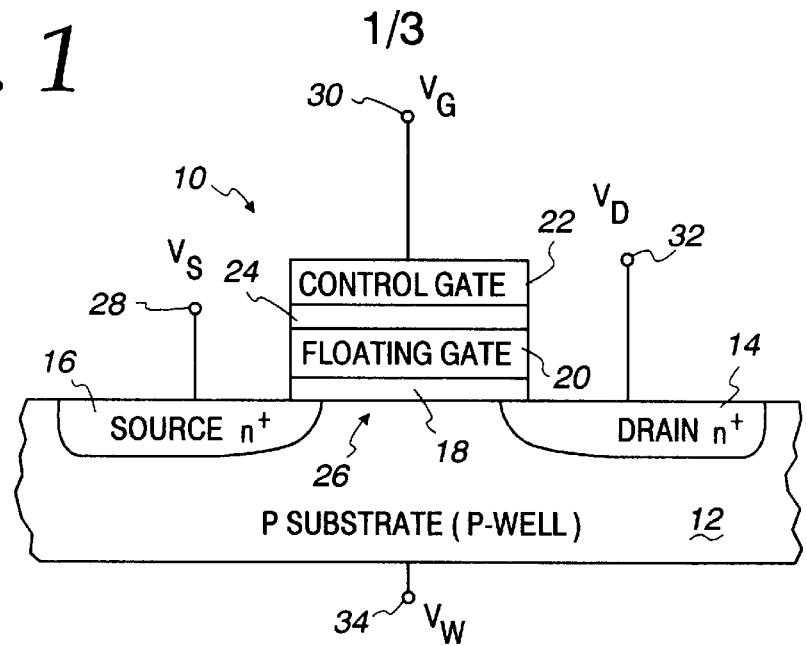
FIG. 1 is a cross-sectional view of a conventional flash EEPROM cell having a floating gate.
Figure 3:
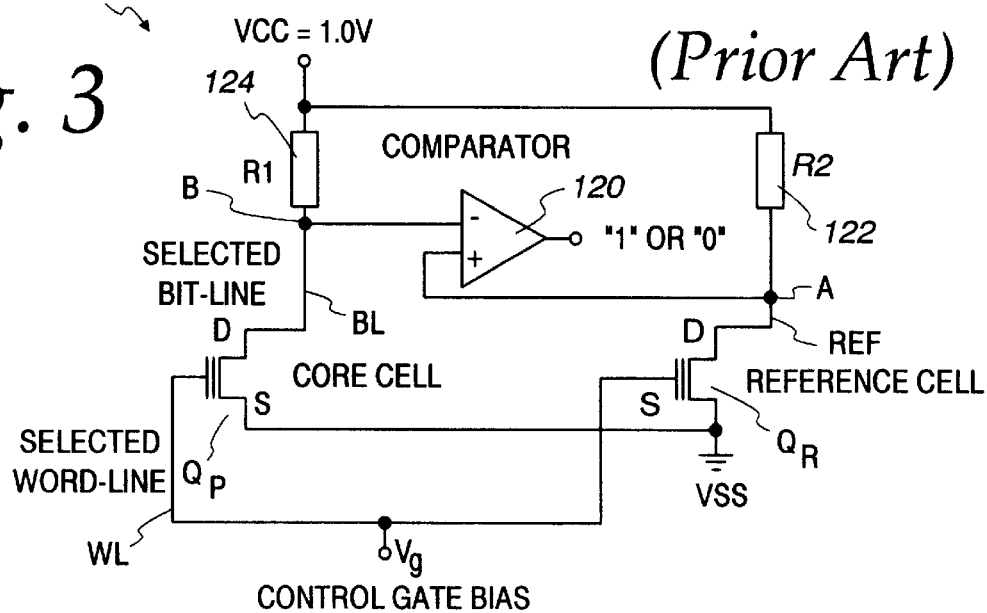
FIG. 3 is a simplified schematic circuit diagram of certain portions of the memory circuit device of FIG. 2.
Figure 2:
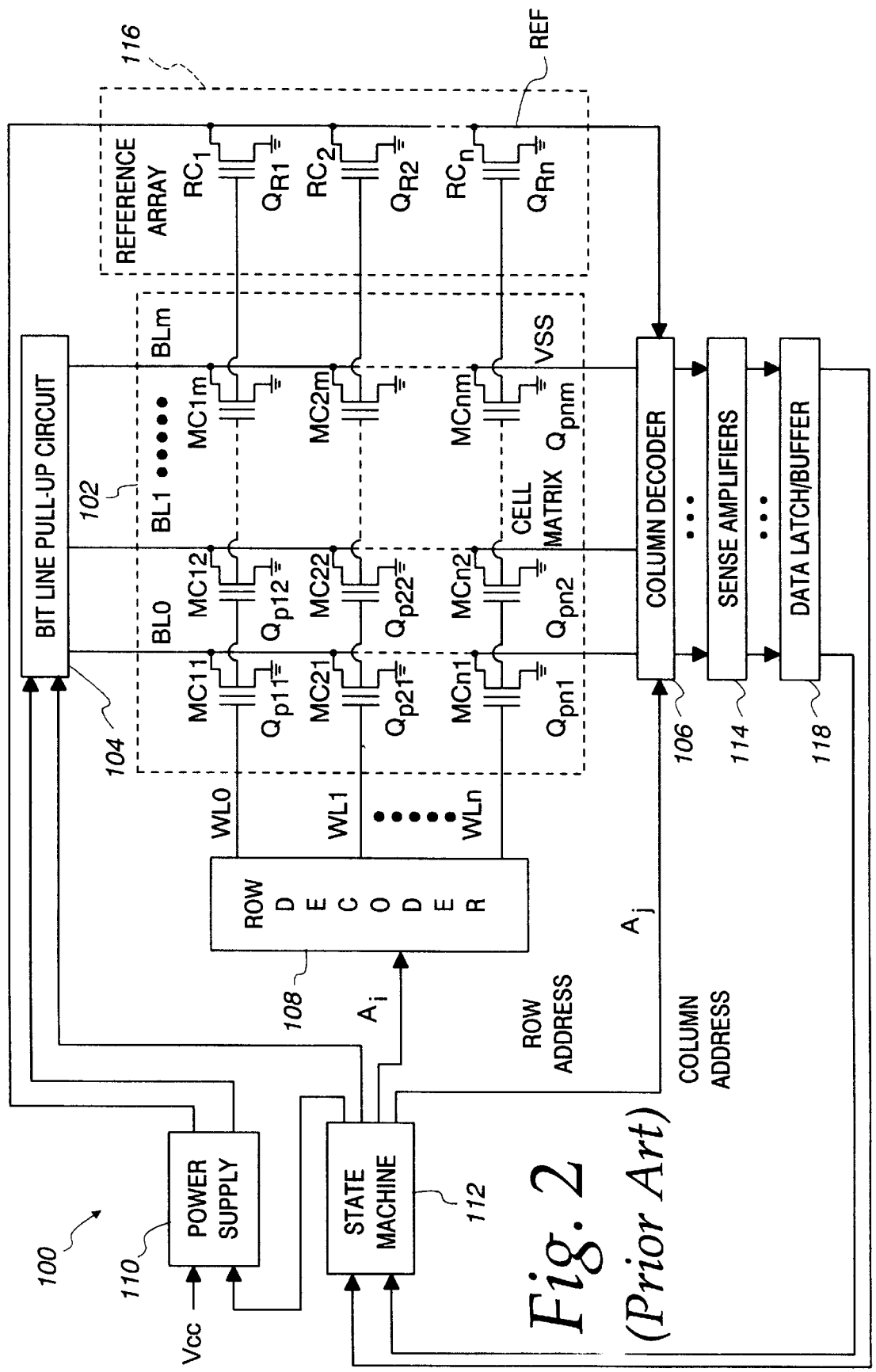
FIG. 2 is a simplified functional block diagram of a conventional semiconductor memory circuit device, including a flash EEPROM memory array and circuitry for enabling the programming, erasing and reading in the array.
Figure 4:
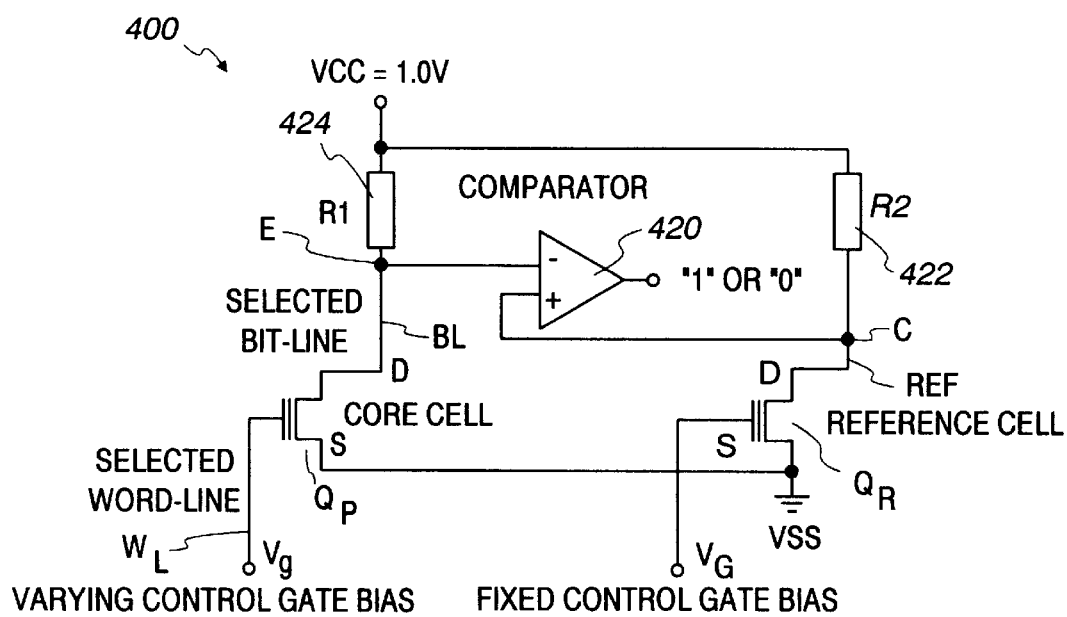
FIG. 4 is a simplified circuit diagram, similar to FIG. 3, but to which the principles of the present invention have been employed.

Referring now in detail to the drawings, there is shown in FIG. 4 a schematic circuit diagram, similar to FIG. 3, of certain portions of a memory circuit device defining a threshold measurement circuitry 400, to which the principles of the present invention have been employed. Unlike the traditional prior art threshold measurement technique used in FIGS. 2 and 3, the measurement method of the present invention is capable of determining the value of the threshold voltage of a memory core cell by merely reading the core cell. In other words, after the reading results of the cell is obtained, the threshold voltage of the cell is immediately known without any elaborate and complicated calculations as required in the '496 patent of the prior art. Therefore, the threshold voltage value can be obtained quickly and reliably on an effective and efficient basis.

The threshold measurement circuitry 400 in FIG. 4 of the present invention includes a comparator 420, a reference resistor 422 having a resistive value R2, a sense resistor 424 having a resistance value R1 (R1=R2), a core transistor $Q_P$, and a reference transistor $Q_R$. The reference resistor 422 has its one end connected to a supply potential or voltage VCC, which is typically at +1.0 volts, and its other end connected to the non-inverting input of the comparator 420 at node C. The node C is joined to the drain of the reference transistor $Q_R$ via a reference bit line REF. One end of the sense resistor 424 is also connected to the supply potential VCC, and the other end is connected to the inverting input of the comparator 420 at node E. The node E is also connected to the drain of the core transistor $Q_P$ via the selected bit line BL. Thus far, the structural circuit components and their interconnection of the measurement circuitry 400 of FIG. 4 is identical to the measurement circuitry 300 of FIG. 3.

However, it should be noted that, unlike the prior art of FIG. 3, the value of the resistors 422 and 424 are equal in value rather than being a ratio or a portion of each other. In other words, there is no sense ratio network required in the present invention. Further, it can be seen that the control gates of the core transistor $Q_P$ and the reference transistor $Q_R$ are not connected together so as to receive the same varying control gate bias voltage $V_G$ as in FIG. 3. In particular, only the control gate of the core transistor $Q_P$ is connected to the varying control gate bias voltage $V_g$ via the selected word line WL. On the other hand, the control gate of the reference transistor $Q_R$ is connected to a fixed control gate bias voltage $V_G$.

Figure 5:
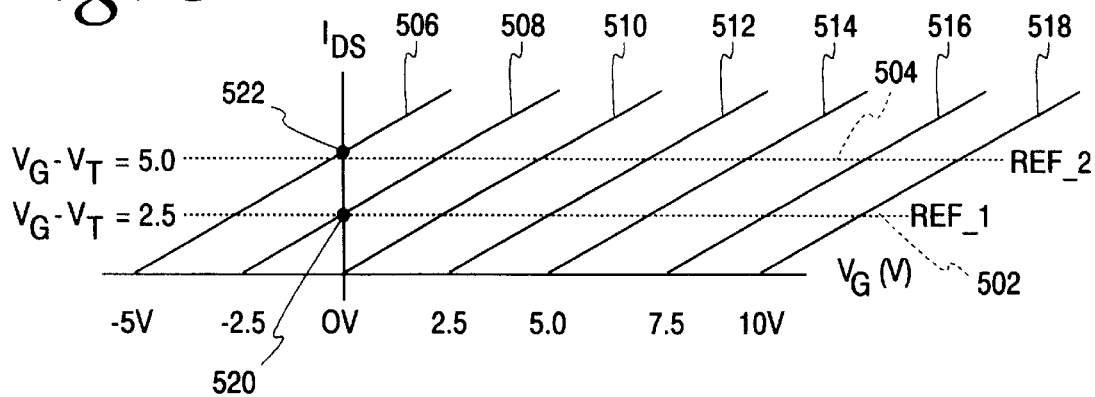
FIG. 5 shows plots of a family of curves, representing the current $I_{DS}$ of core transistors having different threshold voltages $V_{TP}$ as a function of different gate bias $V_G$.

The improved measurement method for determining the value of the threshold voltage $V_{TP}$ of the core transistor $Q_P$ of FIG. 4 of the present invention, which is obtained from the results of reading the core cell, will now be explained with reference to FIG. 5. Initially, a detailed explanation will first be given with respect to how the two dotted lines 502, 504 representing two constant levels of current in FIG. 5 are generated. First, with regard to the line 502 designated as $V_G-V_T=2.5$, for example, this reference level REF1 represents a first current level $I_{DS1}$ generated by a reference cell (similar to $Q_R$) having a first fixed bias condition and a first fixed threshold voltage $V_{TR}$. In other words, a fixed gate voltage $V_G$ is applied to its control gate, a fixed drain voltage $V_D$ is applied to its drain, a fixed source voltage $V_S$ is applied to its source, and a fixed well voltage $V_W$ is applied to its substrate. This reference level REF1 can be set by setting the fixed threshold voltage VR of the reference cell, in any number of ways known in the art such as by programming and/or erasing of the reference cell. Alternatively, the reference level REF1 can be set by setting the gate voltage $V_G$ of the reference cell.

Therefore, by measuring the current flowing in the reference transistor when it is first turned on, the relationship between the threshold voltage $V_{TR}$ and the fixed gate voltage $V_G$ can be determined to be $V_{G-VT}=2.5$, which is unique and constant, corresponding to the first current level REF1. It should be noted that the difference between $V_G$ and $V_T$ ($V_G-V_T$) is constant for any given value of $V_G$ and $V_T$. Thus, as long as the difference $V_G-V_T$ is constant then the corresponding current level $I_{DS}$ will be constant.

Similarly, the second reference level REF2 representing a second current level $I_{DS2}$ generated by a second reference cell having a second fixed bias condition and a second fixed threshold voltage. The line 504 satisfies the relationship $V_G-V_T=5.0$.

Figure 6:
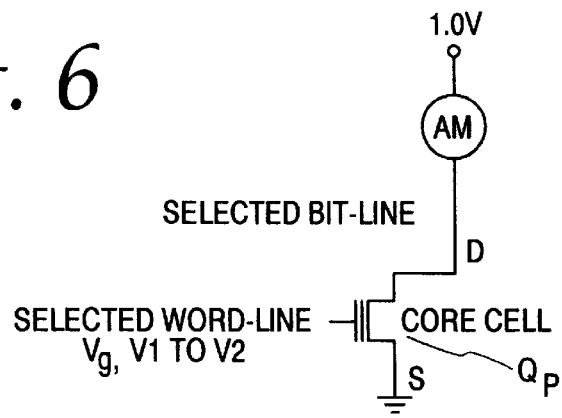
FIG. 6 is a simplified schematic circuit diagram, illustrating how one of the curves of FIG. 5 can be obtained.

Next, it will be explained how the family of curves 506–518 are generated, each curve representing a particular cell in the array having a different threshold voltage $V_T$. Each of the curves 506–518 is a plot of the current $I_{DS}$ as a function of the applied fixed gate voltage $V_G$. In FIG. 6, there is shown a simplified schematic circuit diagram which illustrates how the current measurement for $I_{DS}$ can be obtained as a function of the gate voltage. For example, in order to plot the curve 508, the gate bias voltage $V_g$ applied to the control gate via the selected word line of the core cell $Q_P$ is varied or swept between a low voltage V1 and a high voltage V2 and by recording the current indicated on the amp meter AM connected in series between the power supply VCC and the drain D of the core cell. It should be understood that all of the remaining curves 506, 510–518 are not required to be generated by such current measurement. Since all of the memory core transistors in the array are identical in structure as well as being identical to the reference cells, once the curve 508 is produced the remaining curves 506, 510–518 can be simply extrapolated from the curve 508.

With specific reference to the curve 508, it can be observed that this particular cell has a threshold voltage $V_{TP}$ equal to −2.5 V. Further, it will be noted that at a fixed gate voltage $V_G=0$ the current flowing in this cell equals the first reference level REF1 (see point 520). Similarly, the curve 506 corresponds to a cell which has a threshold voltage equal to −5.0 V and at the fixed gate voltage $V_G=0$ the current flowing in the cell is equal to the second reference level REF2 (see point 522). The remaining curves 510 through 518 correspond to cells which have threshold voltages of 0, +2.5 V, +5.0 V, +7.5 V, and +10 V, respectively.

After the reference levels have been set by the manufacturer and are not adjustable by a user and after the $I_{DS}$ curves have been plotted, FIG. 5 can then be used to determine the value of the threshold voltage of the memory core transistor in the memory array by simply reading the cell. Assume that the reference cell $Q_R$ in FIG. 4 has been set to have a reference current REF1 and that the core transistor $Q_P$ has an $I_{DS}$ curve that follows the curve 508. When the varying control gate bias $V_g$ applied to the control gate of the core transistor $Q_p$ is being swept and is less than 0 volts (i.e., $V_G<0$) then the output of the comparator 420 will be at a low or "0" logic level since the current $I_{DS}$ flowing in the core transistor $Q_p$ will be less than the reference current ($I_{DS}<REF1$). On the other hand, when the varying control gate bias $V_g$ is being swept and is greater than 0 volts, then the output of the comparator 420 will be at a high or "1" logic level. This is because the current $I_{DS}$ flowing in the core transistor $Q_P$ will be greater than the reference current ($I_{DS}>REF1$).

Therefore, the read results of this particular core transistor $Q_P$ will be switched or changed from a "0" to "1" at an applied gate voltage of $V_G=0$, which is defined as the switched voltage $V_{SW}$ since only a cell having a threshold voltage equal to −2.5 V will be switched at $V_G=0$, then the relationship between the threshold voltage and the switched voltage is unique. Consequently, by simply monitoring the output of the comparator 420, it is possible to determine the switched voltage $V_{SW}$ at which the read results of a cell will be changed between "0" and "1." At this point, the value of the threshold voltage of the particular cell will be immediately known (i.e., $V_{SW}-2.5=V_T$). In this case, the core transistors $Q_P$ will be switched at $V_{SW}=0$ and thus have a threshold voltage $V_T=-2.5$ V, as can be seen from the curve 508 of FIG. 5.

With the reference current being set to the reference level REF1, it will be apparent that this new method of the present invention can measure a threshold voltage as low as −2.5 V without requiring the use of a negative power supply source ($V_G > 0$). In particular, it is usually not desirable or convenient to require negative supplies for MOS integrated circuits from a design point of view. In the event that a still lower threshold voltage is required to be measured, the second reference level REF2 may be set and used. In this latter case, this method can measure a threshold voltage $V_T$ as low as −5 V, but yet still maintain a positive gate bias voltage.

On the other hand, if the upper positive value of the gate bias voltage is limited to, for example, +10 V and a cell having a threshold voltage $V_T = 9$ V needs to be measured, then the current level $I_{DS}$ can be made to be lower than the first reference level REF1. This is achieved by the provision of a reference cell with a fixed bias condition and a fixed threshold voltage $V_T$, such that $V_G - V_T = 1$ V. In this manner, the constant value of $V_G - V_T$ of a particular reference cell can be either set to a high logic level, such as the reference level REF2, so as to measure the threshold voltage $V_T$ of an over-erased cell (i.e., $V_T < 2$ V), or to a low level, such as reference level REF1, so as to measure the threshold voltage $V_T$ of a programmed cell (i.e., $V_T > 7$ V). As previously pointed out, the reference current level can be set either by setting the threshold voltage $V_T$ of the reference cell or by setting the gate bias of the reference cell.

From the foregoing detailed description, it can thus be seen that the present invention provides a method of measuring the value of the threshold voltage of a memory core cell by simply reading the core cell. Since the read speed is significantly faster than a current and/or voltage measurement, then the speed of the threshold measurement has been substantially improved by the present method. This is achieved by the provision of a reference cell having a reference current which is fixed at a constant value with respect to the bias voltage applied to the control gate of the reference cell. Since the relationship between a switched voltage and the threshold voltage of the reference cell is linear and straightforward, there has been eliminated the need of any complicated extraction process. As a result, the threshold voltage of the core cell can be obtained rapidly from the read results. In addition, the threshold voltage of the memory core cells having a wide range between a significantly over-erased state ($V_T < -2$ V) and a programmed state ($V_T > 7$ V) can be measured while maintaining the bias voltage applied to the control gate to be positive.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A method of measuring the value of the threshold voltage of a memory core cell in an array of flash EEPROM memory core cells, said method comprising the steps of:

providing a cell matrix having a plurality of memory cells arranged in rows of word lines and columns of bit lines intersecting said rows of word lines, each of said memory cells including a floating gate array core transistor having its control gate connected to one of said rows of word lines, its drain connected to one of said columns of bit lines, and its source and substrate connected to a ground potential;

each of said array core transistors having a corresponding array threshold voltage which is to be measured;

providing a reference current at a constant value which is generated by a reference cell transistor having a fixed bias condition and a fixed threshold voltage so that the relationship of the bias voltage applied to its gate and said fixed threshold voltage is linear;

varying continuously a control gate bias voltage applied to the gate of said array core transistor having the array threshold voltage which is to be measured; and comparing said varied control gate bias voltage and said reference current level and generating a high logic when said varied control gate bias voltage produces a core cell current which is greater than said reference current level to obtain immediately the value of the threshold voltage of the array core transistor.

2. A method of measuring the value of the threshold voltage as claimed in claim 1, wherein said reference current is selected by setting said fixed threshold voltage of said reference cell.

3. A method of measuring the value of the threshold voltage as claimed in claim 1, wherein said reference current level is selected by setting the bias voltage applied to the control gate of said reference cell.

4. A method of measuring the value of the threshold voltage as claimed in claim 1, wherein the relationship of the bias voltage applied to the gate of said reference cell and its threshold voltage is set to a high level so as to measure threshold voltages of over-erased cells.

5. A method of measuring the value of the threshold voltage as claimed in claim 1, wherein the relationship of the bias voltage applied to the gate of said reference cell and its threshold voltage is set to a low level so as to measure threshold voltages of programmed cells.

6. A method of measuring the value of the threshold voltage as claimed in claim 1, wherein said reference current level of said reference cell is adjusted to one of a high level for measuring threshold voltages of over-erased cells and a low level to measure threshold voltages of programmed cells.

7. A method of measuring the value of the threshold voltage as claimed in claim 1, wherein said varied control gate bias voltage is always positive.

8. A method of measuring the value of the threshold voltage as claimed in claim 7, wherein said varied control gate bias voltage is varied in a range between 0 volts and 10 volts.

9. A method of measuring the value of the threshold voltage as claimed in claim 1, wherein said reference transistor has its gate connected to a fixed gate voltage, its drain connected to a fixed drain voltage, and its source and substrate connected to said ground potential.

10. In a semiconductor integrated circuit memory device having a threshold measurement circuitry for measuring the value of the threshold voltage of a memory core cell in an array of flash EEPROM memory core cells, said measurement circuitry comprising in combination:

a cell matrix having a plurality of memory cells arranged in rows of word lines and columns of bit lines intersecting said rows of word lines, each of said memory cells including a floating gate array core transistor having its control gate connected to one of said rows of word lines, its drain connected to one of said columns of bit lines, and its source and substrate connected to a ground potential;

each of said array core transistors having a corresponding array threshold voltage which is to be measured;

a reference current at a constant value being generated by a reference cell transistor having a fixed bias condition and a fixed threshold voltage so that the relationship of the bias voltage applied to its gate and said fixed threshold voltage is linear;

a control gate bias voltage applied to the gate of said array core transistor having the array threshold voltage which is to be measured being varied continuously; and means for comparing said varied control gate bias voltage and said reference current level and for generating a high logic when said varied control gate bias voltage produces a core cell current which is greater than said reference current level to obtain immediately the value of the threshold voltage of the array core transistor.

11. In a semiconductor integrated circuit memory device as claimed in claim 10, wherein said reference current is selected by setting said fixed threshold voltage of said reference cell.

12. In a semiconductor integrated circuit memory device as claimed in claim 10, wherein said reference current level is selected by setting the bias voltage applied to the control gate of said reference cell.

13. In a semiconductor integrated circuit memory device as claimed in claim 10, wherein the relationship of the bias voltage applied to the gate of said reference cell and its threshold voltage is set to a high level so as to measure threshold voltages of over-erased cells.

14. In a semiconductor integrated circuit memory device as claimed in claim 10, wherein the relationship of the bias voltage applied to the gate of said reference cell and its threshold voltage is set to a low level so as to measure threshold voltages of programmed cells.

15. In a semiconductor integrated circuit memory device as claimed in claim 10, wherein said reference current level of said reference cell is adjusted to one of a high level for measuring threshold voltages of over-erased cells and a low level to measure threshold voltages of programmed cells.

16. In a semiconductor integrated circuit memory device as claimed in claim 10, wherein said varied control gate bias voltage is always positive.

17. In a semiconductor integrated circuit memory device as claimed in claim 16, wherein said varied control gate bias voltage is varied in a range between 0 volts and 10 volts.

18. In a semiconductor integrated circuit memory device as claimed in claim 10, wherein said reference transistor has its gate connected to a fixed gate voltage, its drain connected to a fixed drain voltage, and its source and substrate connected to said ground potential.

* * * * *